United States Patent
Murano et al.

(10) Patent No.: US 9,728,973 B2
(45) Date of Patent: Aug. 8, 2017

(54) POWER SOURCE DEVICE

(71) Applicant: SION ELECTRIC CO., LTD., Hokkaido (JP)

(72) Inventors: Minoru Murano, Hokkaido (JP); Suminobu Akiba, Hokkaido (JP); Shin Tanahashi, Hokkaido (JP)

(73) Assignee: SION ELECTRIC CO., LTD., Hokkaido (JP)

(*) Notice: Subject to any disclaimer, the term of this patent is extended or adjusted under 35 U.S.C. 154(b) by 0 days.

(21) Appl. No.: 15/036,489

(22) PCT Filed: Nov. 5, 2014

(86) PCT No.: PCT/JP2014/005560
§ 371 (c)(1),
(2) Date: May 13, 2016

(87) PCT Pub. No.: WO2015/072110
PCT Pub. Date: May 21, 2015

(65) Prior Publication Data
US 2016/0301215 A1    Oct. 13, 2016

(30) Foreign Application Priority Data
Nov. 14, 2013  (JP) .................. 2013-235985

(51) Int. Cl.
*H02J 1/00* (2006.01)
*H02J 3/00* (2006.01)
(Continued)

(52) U.S. Cl.
CPC ........ *H02J 3/385* (2013.01); *H01L 31/02021* (2013.01); *H02J 1/108* (2013.01);
(Continued)

(58) Field of Classification Search
CPC ....... H01L 31/02021; H02J 1/108; H02J 3/12; H02J 3/385; H02J 3/50; H02S 10/00; H02S 10/10; Y02E 10/58
(Continued)

(56) References Cited

U.S. PATENT DOCUMENTS

2001/0035180 A1    11/2001  Kimura et al.
2010/0156185 A1*   6/2010  Kim .................... H01M 16/003
                                            307/72

FOREIGN PATENT DOCUMENTS

JP    5-83880      4/1993
JP    2000-89841   3/2000
(Continued)

OTHER PUBLICATIONS

International Search Report issued Jan. 27, 2015 in International (PCT) Application No. PCT/JP2014/005560.

*Primary Examiner* — Rexford Barnie
*Assistant Examiner* — Toan Vu
(74) *Attorney, Agent, or Firm* — Wenderoth, Lind & Ponack, L.L.P.

(57) ABSTRACT

A power source apparatus that combines power generated by a photovoltaic system and power generated from another power source by using a power combiner and transmits the combined power to a load side, wherein an output voltage of the photovoltaic system can be changed by changing a cell connection state of a plurality of solar cells of the photovoltaic system, and the highest efficiency of the photovoltaic system can be obtained by adding the output voltage of the photovoltaic system to an output voltage of the another power source.

2 Claims, 15 Drawing Sheets

(51) Int. Cl.
*H02J 3/38* (2006.01)
*H02S 10/00* (2014.01)
*H01L 31/02* (2006.01)
*H02J 1/10* (2006.01)
*H02S 10/10* (2014.01)
*H02J 3/12* (2006.01)
*H02J 3/50* (2006.01)

(52) U.S. Cl.
CPC ....... *H02J 3/12* (2013.01); *H02J 3/50* (2013.01); *H02S 10/00* (2013.01); *H02S 10/10* (2014.12); *Y02E 10/58* (2013.01)

(58) Field of Classification Search
USPC .......................................................... 307/86
See application file for complete search history.

(56) References Cited

FOREIGN PATENT DOCUMENTS

| | | |
|---|---|---|
| JP | 2001-312319 | 11/2001 |
| WO | 2011/041020 | 4/2011 |

\* cited by examiner

POWER SOURCE DEVICE

TECHNICAL FIELD

The present invention relates to a power source apparatus that combines power from a photovoltaic system and power from other power sources and transmits the combined power to a load side, and more particularly, to a power source apparatus capable of simply changing a connection state of a plurality of solar cells of the photovoltaic system and operating the photovoltaic system at the maximum power point with a simple configuration.

BACKGROUND ART

Efficiency of a photovoltaic system (power output from the photovoltaic system under the same irradiance) significantly changes depending on a use condition thereof such as a voltage used when the power is output from the photovoltaic system (FIG. 9).

Therefore, in order to fully use energy from the photovoltaic system, it is necessary to maintain a condition in which the power obtained from the photovoltaic system is maximized. For this purpose, a device for detecting and tracking a maximum power point of the photovoltaic system is necessary. However, this device is typically complicated and expensive, so that a total cost of the power source apparatus increases unfortunately. In addition, a method of detecting and tracking the maximum power point of the prior art such as a so-called "hill-climbing method" causes a power loss.

If the employed photovoltaic system is restricted (if characteristics of the employed photovoltaic system are known in advance), a voltage range for obtaining the maximum efficiency is also restricted. Therefore, it is possible to obtain the highest efficiency operation at a constant voltage without employing the hill climbing method or the like. Even in this case, an additional power circuit is necessary to adjust and convert the power, and this causes an increased coast and decreased efficiency. In this regard, if the power adjustment and conversion can be implemented without employing the power circuit, it is possible to remarkably reduce cost and improve efficiency.

CITATION LIST

Patent Literatures

Patent Literature 1: Japanese Patent Application Publication No. 2011-181055

SUMMARY OF INVENTION

In view of the aforementioned problems, it is therefore an object of the present invention to provide a power source apparatus capable of operating in the vicinity of the highest efficiency point of a photovoltaic system without using an additional circuit such as a constant voltage circuit with a significantly simple configuration.

In addition, it is another object of the present invention to provide a control method for searching and tracking the maximum power point of the photovoltaic system with a loss of the generated power less than that of the hill climbing method employed in the prior art.

In the hill climbing method typically employed to use the photovoltaic system at the maximum power point, tracking to a condition for a higher power output is performed by comparing power values generated under different conditions. For example, referring to FIG. 9, when the output voltage of the photovoltaic system is set to "$V_a$," the output power of the photovoltaic system becomes "$P_a$." Then, when the output voltage of the photovoltaic system is changed to a voltage "$V_b$" higher than "$V_a$," the output power becomes "$P_b$." Here, the output power is compared between "$P_a$" and "$P_b$." In this example, since "$P_b$" is higher, the voltage "$V_b$" is maintained (in contrast, if "$P_b$" is lower, the voltage is returned to "$V_a$").

In this manner, in the hill climbing method, the maximum power point tracking is performed by changing the operating point, comparing the generated power with the previous power, and advancing to a state of the higher generated power. Meanwhile, when the operating point is already set to the maximum power point, it is not necessary to change the operating point naturally. However, it is difficult to determine whether or not the maximum power is obtained at the operating point if comparison of the generated power is not performed under different conditions. Therefore, comparison is performed by generating power under different conditions at all times. For this reason, power is generated under conditions different from that of the maximum power point, and this degrades efficiency.

According to the present invention, it is possible to prevent such degradation of efficiency.

Acxxrding to an aspect of the present invention, there is provided a power source apparatus that combines power generated by a photovoltaic system and power generated from another power source by using a power combiner and transmits the combined power to a load side, wherein an output voltage of the photovoltaic system can be changed by changing a cell connection state of a plurality of solar cells of the photovoltaic system, and the highest efficiency of the photovoltaic system can be obtained by adding the output voltage of the photovoltaic system to an output voltage of the another power source.

According to another aspect of the present invention, there is provided a power source apparatus that combines power generated by a photovoltaic system and power generated from the other power source by using a power combiner and transmits the combined power to a load side, wherein an output voltage of the photovoltaic system can be changed by changing a cell connection state of a plurality of solar cells of the photovoltaic system in consideration of a voltage corresponding to a highest efficiency point of the solar cell, and the highest efficiency of the photovoltaic system can be obtained by adding the output voltage of the photovoltaic system changed in consideration of a voltage corresponding to a highest efficiency point of the solar cell to an output voltage of the another power source.

In the power source apparatus described above, a cell connection state of the photovoltaic system may be changed by changing a connection state of a plurality of solar cells in series and in parallel.

In the power source apparatus described above, the photovoltaic system can be used at the highest efficiency automatically and continuously by preparing a plurality of strings having different numbers of solar cells connected in series, detecting the number of solar cells connected in series by which the highest efficiency of the photovoltaic system can be obtained by comparing current values of the plurality of strings, changing a circuit configuration to match the number of solar cells connected in series by which the highest efficiency of the photovoltaic system can be obtained, and repeating this process.

Specifically, in the prior art, the power generated from the photovoltaic system is measured, and the voltage output from the photovoltaic system is adjusted using a power conversion circuit and the like such that the power is maximized. However, according to the present invention, reversely, the circuit connection of the photovoltaic system is modified to match the output voltage such that the photovoltaic system is operated at the highest efficiency. In addition, the maximum power point tracking can be performed by modifying the cell array of the photovoltaic system.

According to the present invention, it is possible to use the photovoltaic system with high efficiency using a simple structure device. In addition, a power conversion circuit is not necessary in the photovoltaic system side, and a power loss is insignificant. In addition, a complicated process is not necessary in the maximum power point tracking, and the power generation efficiency is not degraded.

Further, by combining the photovoltaic system with another power source, it is possible to stably supply power even when the power generated from the photovoltaic system is reduced.

DESCRIPTION OF EMBODIMENTS

Embodiments

A power source apparatus according to an embodiment of the invention will now be described with reference to the accompanying drawings.

Figure 5:
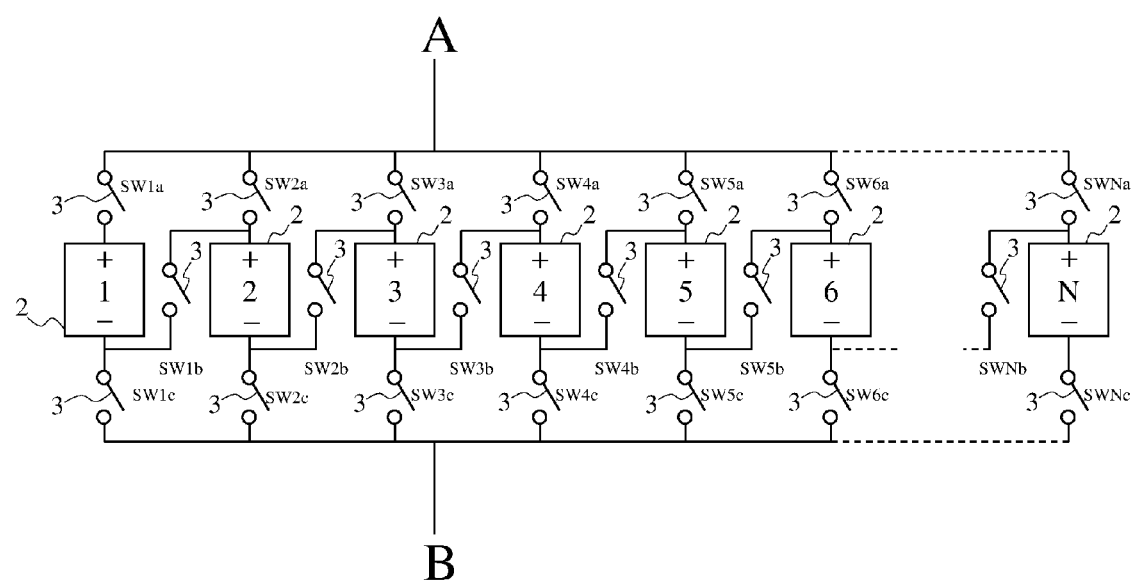
FIG. 5 is an explanatory diagram (2) illustrating a switch circuit for enabling a combination of N solar cells.
Figure 8:
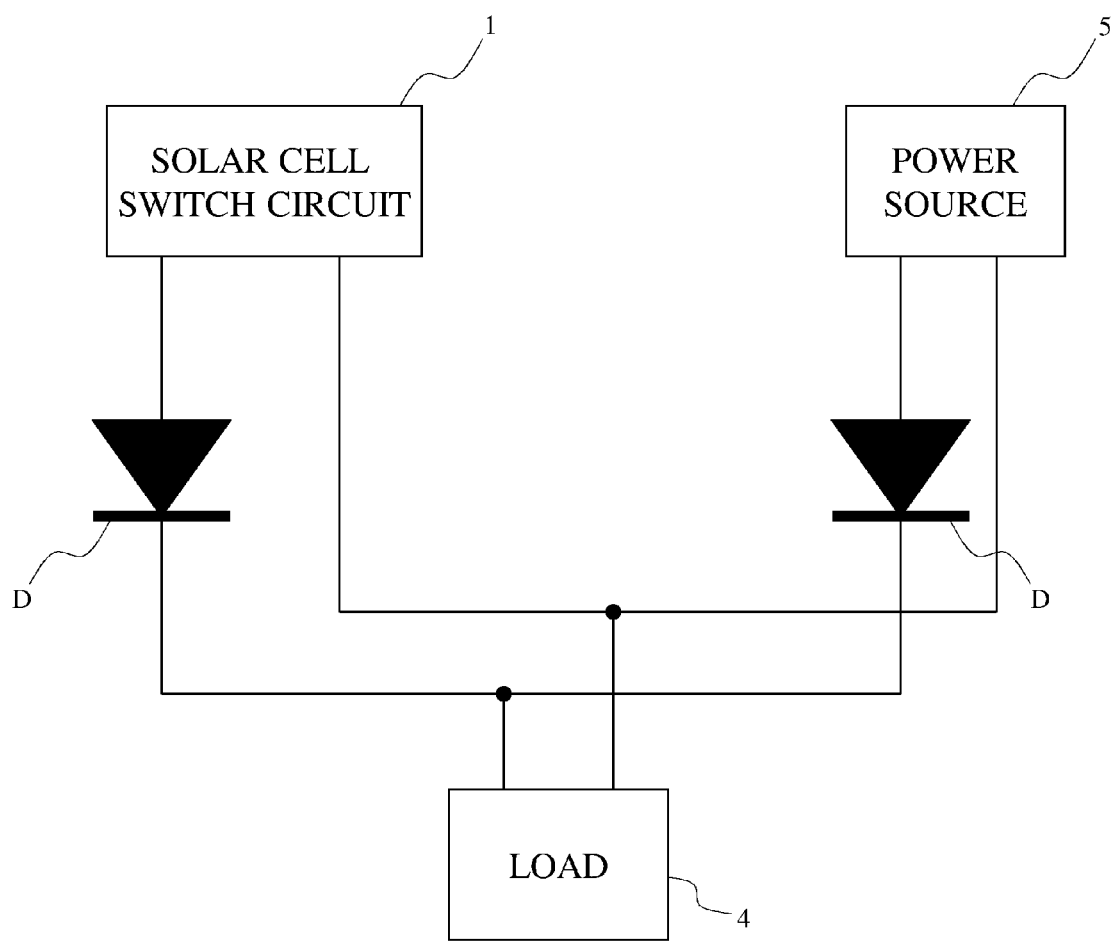
FIG. 8 is a schematic block diagram illustrating a schematic configuration of a power source apparatus according to the present invention.

FIG. 8 is a schematic block diagram illustrating an exemplary configuration of the entire power source apparatus according to the present invention. Here, a solar cell switch circuit 1 includes a plurality of solar cells of the photovoltaic system and switches capable of changing connections of the solar cells as illustrated in FIG. 5, so that the connection of the solar cells 2 can be changed using the switches 3 and the like.

1. Changeable Configuration of Solar Cells 2

The photovoltaic system (solar panel) has a plurality of small-sized solar cells 2. Here, a unit body of the photovoltaic system, that is, the solar cell 2 is formed of polycrystalline silicon, single crystalline silicon, amorphous silicon, or the like depending on its type. The output voltage exhibiting the maximum power is changed depending on the type of the solar cell. In a solar panel of the photovoltaic system employed in general, current and voltage are obtained by connecting the solar cells 2 in series and/or in parallel.

Figure 1:
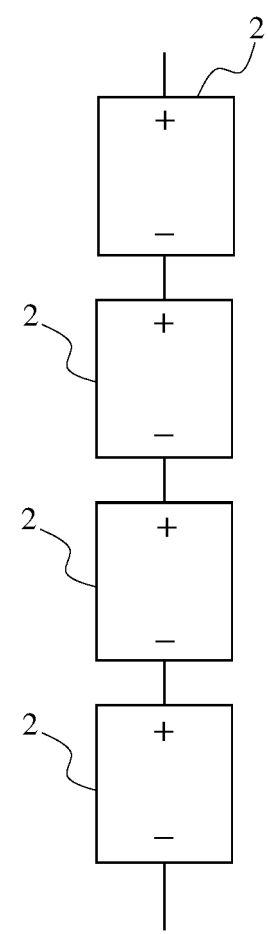
FIG. 1 is an explanatory diagram illustrating a connection for obtaining a high voltage by combining solar cells of a photovoltaic system.

For example, if four solar cells 2 capable of outputting a voltage of 0.5 V and a current of 100 mA under the maximum power condition are connected in series, a voltage of 2 V and a current of 100 mA can be obtained (FIG. 1).

If two solar cells 2 are connected in series to form a series string, and two series strings are connected in parallel, a voltage of 1 V and a current of 200 mA can be obtained with the same number of solar cells.

If four solar cells 2 are connected in parallel, a voltage of 0.5 V and a current of 400 mA can be obtained.

Figure 2:
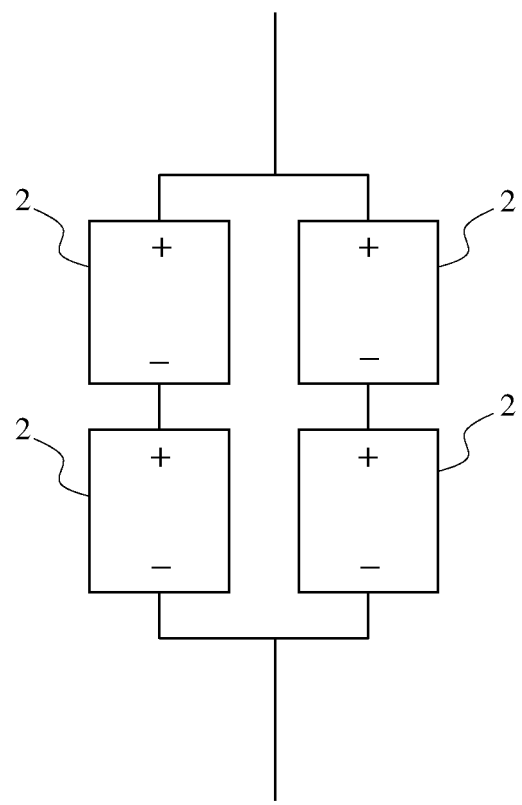
FIG. 2 is an explanatory diagram (1) illustrating a connection for obtaining a voltage and a current by combining solar cells.
Figure 3:
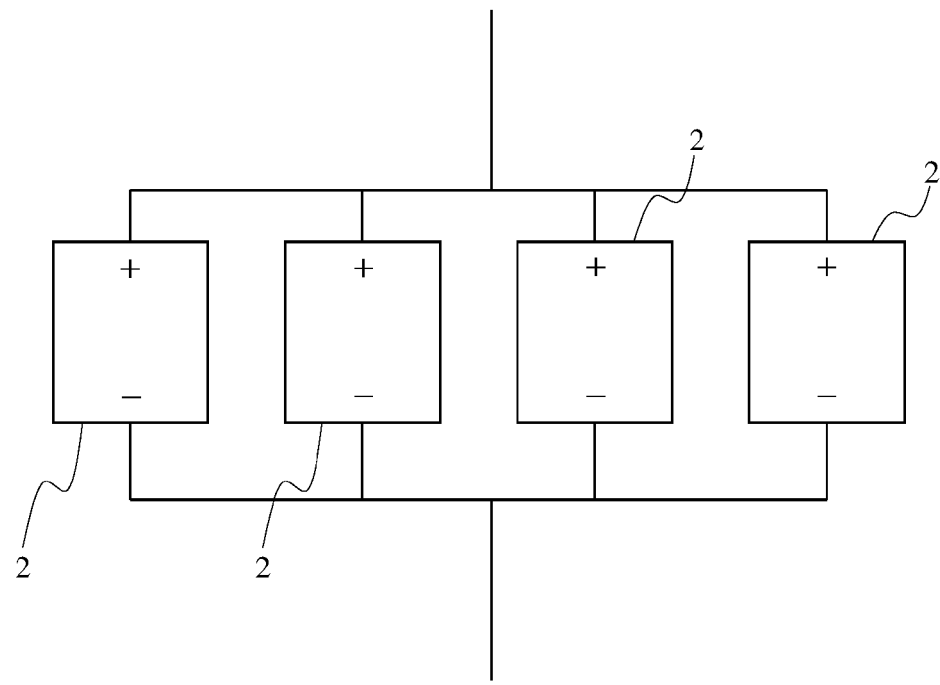
FIG. 3 is an explanatory diagram illustrating a connection for obtaining a large current by combining solar cells.

In this manner, it is possible to set the voltage in the unit of approximately 0.5 V depending on the connection scheme. However, there is a restriction in the connection scheme in order to use all of the solar cells 2 without being wasted. In the case of four solar cells 2, assuming that all of the four solar cells 2 are used, the connection may include a 4-series connection (FIG. 1), a 2-series and 2-parallel connection (FIG. 2), and a 4-parallel connection (FIG. 3) capable of outputting voltages of 2 V, 1 V, and 0.5 V, respectively.

Figure 4:
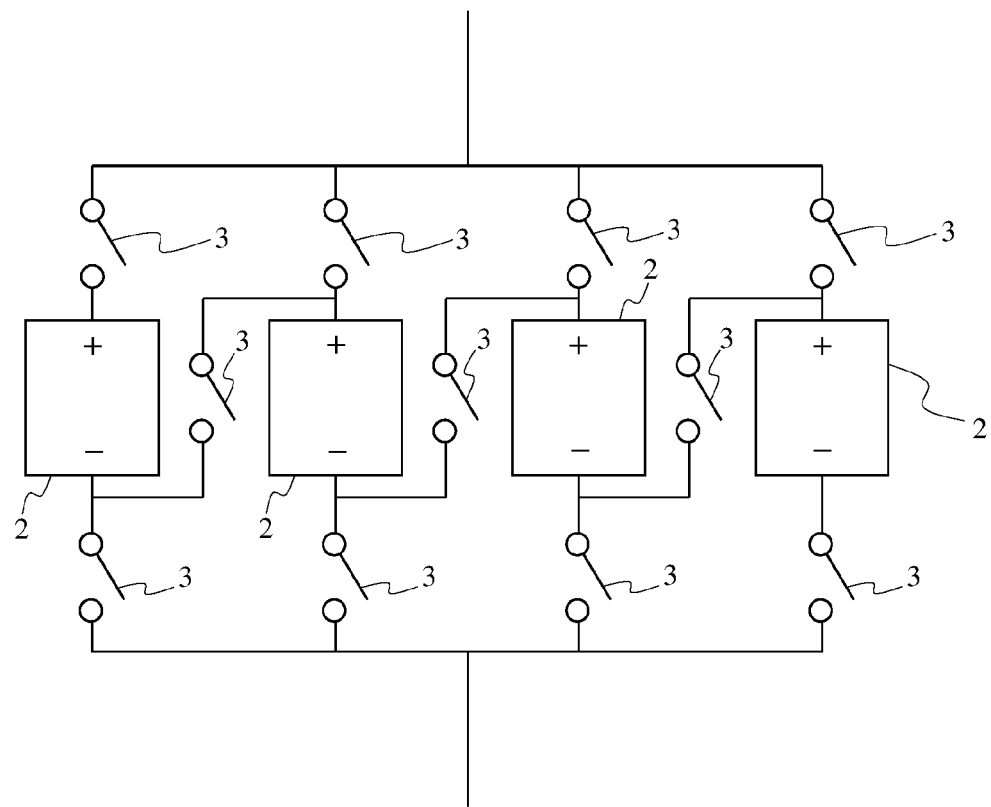
FIG. 4 is an explanatory diagram (1) illustrating a switch circuit for enabling a combination of four solar cells.

A configuration for changing the connection using the switches 3 is illustrated in FIG. 4. If the connection is changed in this manner, all of the connection schemes of FIGS. 1 to 3 can be implemented by switching the switches 3.

FIG. 5 illustrates an exemplary connection of N solar cells.

The connection of the solar cells 3 (1 to N) can be changed by switching the switches 3 (SW1a, SW1b, SW1c, . . . , SWNa, SWNb, SWNc).

Figure 6A:
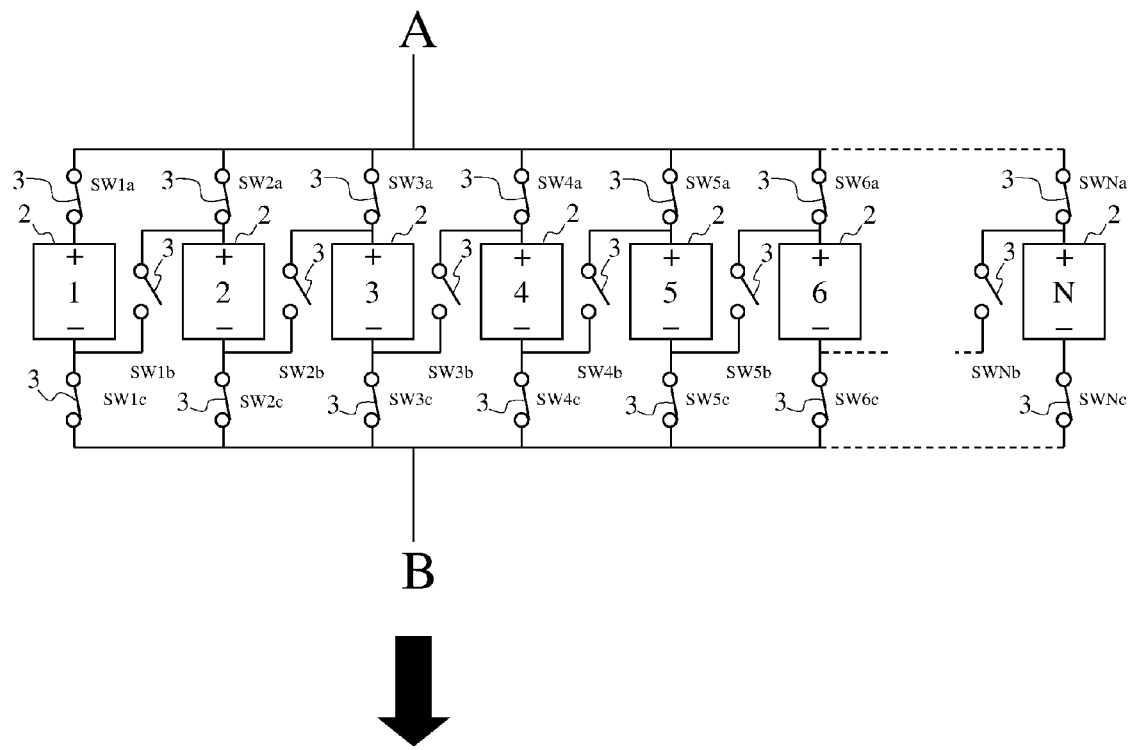
FIGS. 6A and 6B are explanatory diagrams illustrating a method of obtaining a voltage of a single cell in the switch circuit for enabling a combination of N solar cells.
Figure 6B:
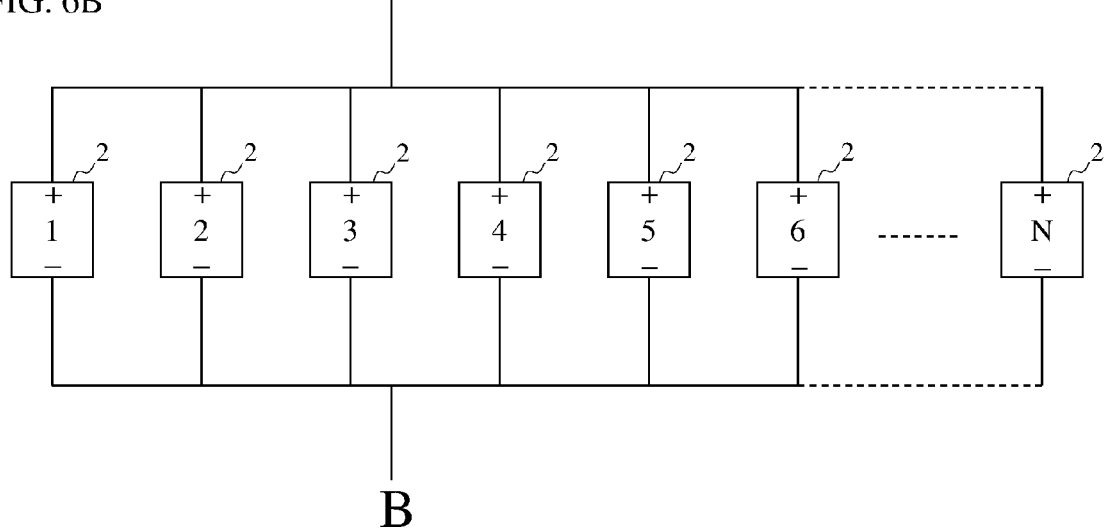

For example, by turning on the switches SW1a, SW1c, SW2a, SW2c, SW3a, SW3c, . . . SWNa, and SWNc and turning off SW1b, SW2b, SW3b, . . . , and SWNb (FIG. 6A), a single solar cell 2 is connected between the terminals A and B (equivalent to the circuit of FIG. 6B).

Figure 7A:
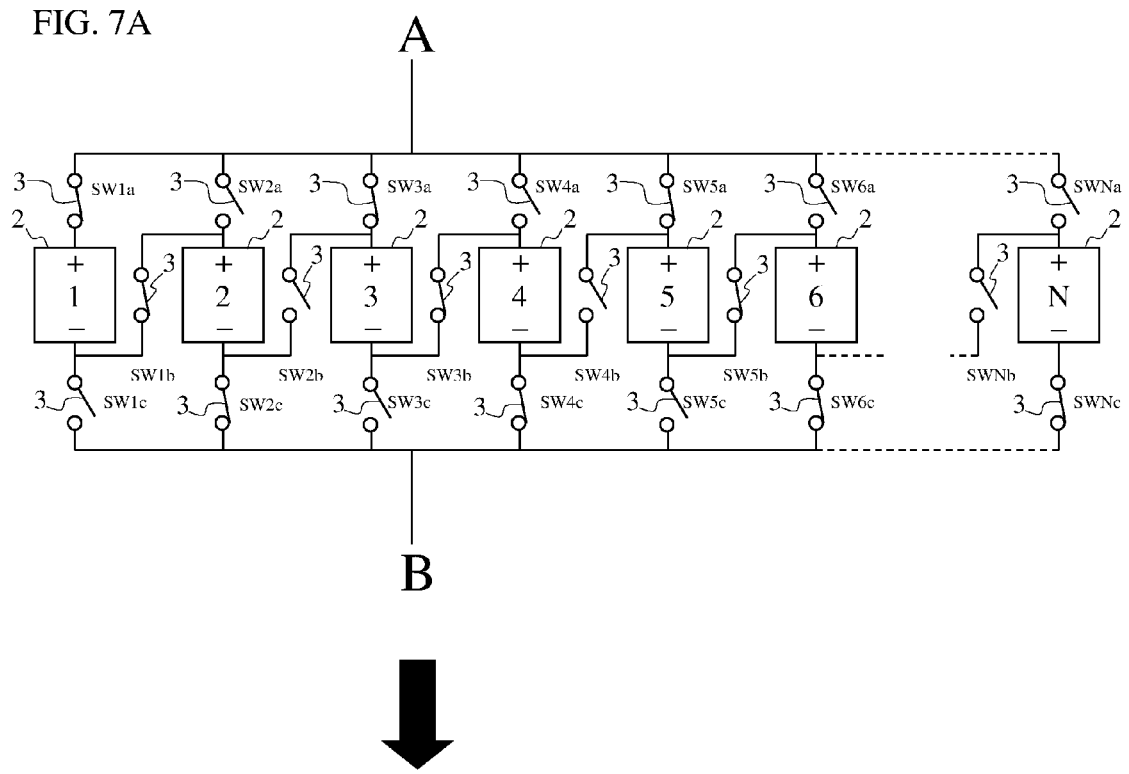
FIGS. 7A and 7B are explanatory diagrams illustrating a method of obtaining a voltage of a pair of cells in the switch circuit for enabling a combination of N solar cells.
Figure 7B:
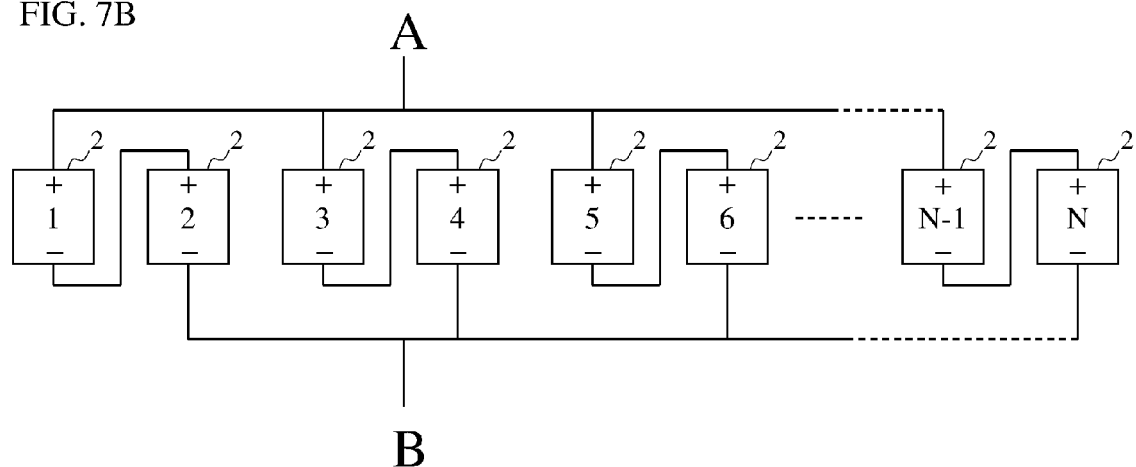

By manipulating the switches 3 as illustrated in FIG. 7A, a pair of solar cells 2 are connected in series between the terminals A and B (equivalent to the circuit of FIG. 7B).

In this manner, the number of solar cells 2 connected between the terminals A and B can be set freely using the switches 3. The voltage is set to "(a voltage of the solar cell 2 (=0.5 V))×(the number of solar cells inserted between the terminals A and B)." Therefore, the voltage can be set in the unit of approximately 0.5 V.

However, in order to use the solar cells 2 without being wasted, it is necessary to set a total number of the solar cells 2 to a multiple of the number of the cells inserted between the terminals A and B.

Note that the connection can be dynamically changed by employing a relay or a semiconductor switching element (such as a transistor or a field effect transistor (FET)) that can be controlled externally as the switch 3.

FIG. 8 is a circuit diagram illustrating the (entire) circuit according to the present invention. The description will continue with reference to FIG. 8.

Here, "D" denotes a backflow prevention member. In FIG. 8, a backflow prevention diode is employed. Alternatively, any other switching element such as a semiconductor switch (such as FET) similar to the backflow prevention diode may also be employed.

The power source 5 is a low-impedance power source. When the generated power of the photovoltaic system is insufficient, power from the power source 5 is supplied to the load 4.

Note that the switch 3 of FIG. 5 may also be a semiconductor switch as well as a mechanical switch such as a relay.

Figure 14:
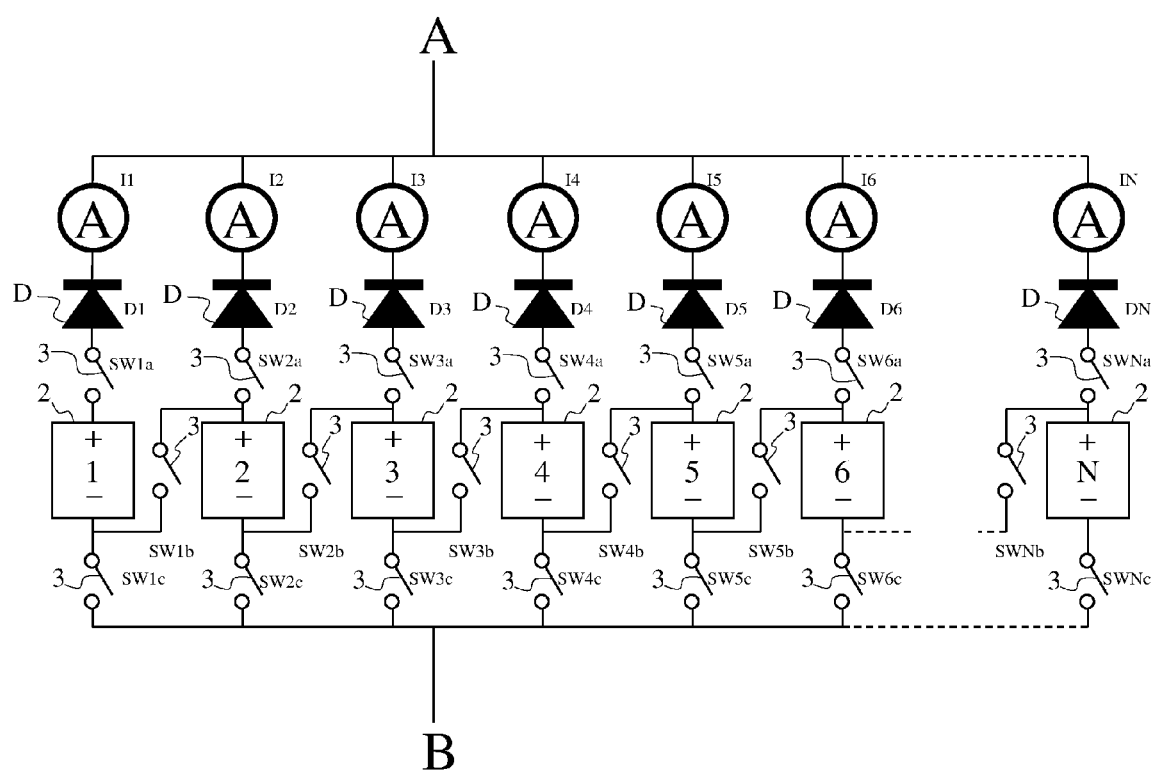
FIG. 14 is an explanatory diagram illustrating a switch circuit for enabling a combination of N solar cells installed with a backflow prevention device D and an ammeter.
Figure 15:
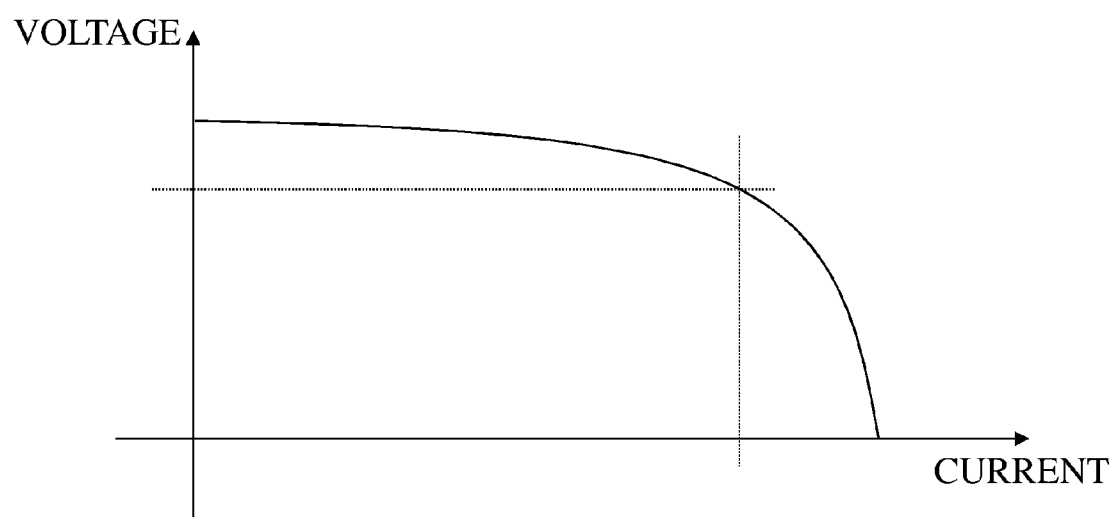
FIG. 15 is a voltage-current characteristic diagram of the photovoltaic system.

Further, the backflow prevention diodes D1 to DN may be inserted into the circuit of FIG. 5 as illustrated in FIG. 14. Similarly, semiconductor switches (such as FETs) may also be employed as the backflow prevention diodes D. As a result, it is possible to reduce efficiency degradation when a part of the solar cells are placed in the shade.

In addition, an ammeter A may be installed to check the current. Here, there is no influence on the operation even when the connection sequence of the backflow prevention diode, the ammeter, and the switches SW1a to SWNa is changed (they may be inserted into the B-side instead of the A-side).

As illustrated in FIG. 14, when the backflow prevention device is inserted into the solar cell side, the backflow prevention member D of the solar cell switch circuit 1 side in FIG. 8, that is, the backflow prevention diode is not necessary and may be omitted as necessary.

Here, a configuration, a voltage, and a current of the solar cell 2 will be described by way of example. Assuming that there are ten cells each capable of outputting a voltage of 0.5 V and a current of 100 mA, the voltage can be set to 0.5 to 5 V in the unit of 0.5 V. The output voltage and current are shown in the following table.

number of cells connected in series
output voltage
output current
surplus cell
efficiency For example, assuming that there are ten cells 2, a voltage of 4.5 V can be output by connecting nine cells in series. However, a single cell 2 remains. The "surplus cell" in the table denotes the number of such remaining cells 2. In addition, "efficiency" of the table denotes a percentage of the generated power obtained by excluding the power generated by the cell 2 that does not contribute to power generation as the surplus cell. When the number of cells 2 connected in series is set to "1," "2," "5," and "10," the surplus cell is not generated. Therefore, the efficiency becomes 100%.

Assuming that the output voltage is "$V_{PV}$ [V]," the output current is "$I_{PV}$ [A]," the number of cells 2 is set to "N," and the number of cells 2 connected in series is set to "X," the following relationship can be obtained.

Voltage: $V_{PV} \cdot X$ (V)  (Formula 1)

Current: $I_{PV} \cdot \text{int}\left(\frac{N}{X}\right)$ (A)  (Formula 2)

Number of effective cells: $X \cdot \text{int}\left(\frac{N}{X}\right)$  (Formula 3)

Number of surplus cells: $N - X \cdot \text{int}\left(\frac{N}{X}\right)$  (Formula 4)

Efficiency: $100 \cdot \dfrac{X \cdot \text{int}\left(\frac{N}{X}\right)}{N}$ (%)  (Formula 5)

Here, "int(x)" denotes an integer part of a number x.

2. Method of Setting Highest Efficiency Point of Photovoltaic System.

In FIG. 8, if a voltage of the power source 5 is determined, a voltage corresponding to the highest efficiency is adjusted to the voltage of the power source 5 by changing the configuration of the solar cell switch circuit 1.

However, it is supposed that the solar cell switch circuit 1 has the configuration of FIG. 5, and the voltage corresponding to the highest efficiency point of the solar cell 2 is known in advance (here, "0.5 V" by way of example).

As described above in the Chapter 1, the voltage corresponding to maximum power can be changed in the unit of approximately 0.5 V by changing the connection scheme of the solar cells 2.

For example, if the power source 5 outputs a voltage of 10 V, from the viewpoint of the solar cell switch circuit 1, twenty solar cells 2 are necessary to match the voltage of 10 V (0.5 V×20=10 V). Therefore, twenty solar cells 2 may be connected in series between the terminals A and B in FIG. 5.

Figure 9:
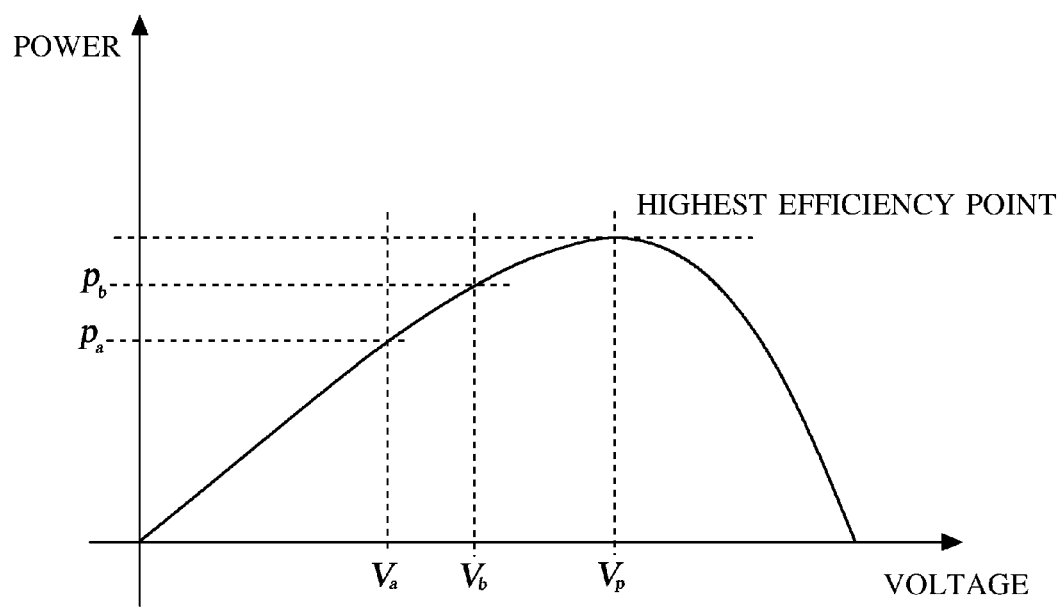
FIG. 9 is an explanatory diagram illustrating an output power characteristic of a photovoltaic system.
Figure 12:
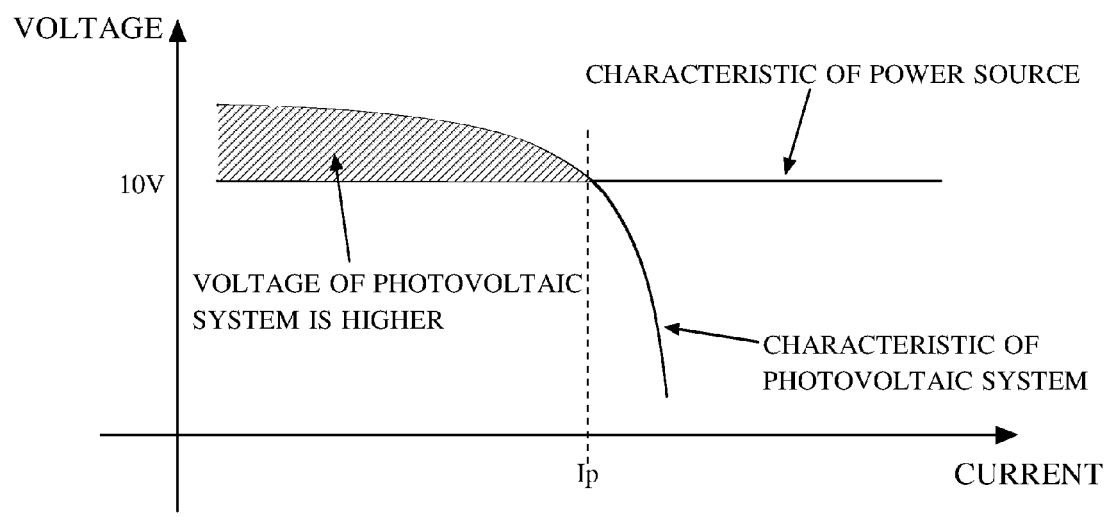
FIG. 12 is an explanatory diagram illustrating operations of the photovoltaic system and a power source 5.

FIG. 9 shows an output characteristic of the photovoltaic system (the relationship between the output voltage and the power). In addition, FIG. 12 shows a relationship between the output voltage and the output current in the same photovoltaic system.

In the case of a small load (that is, the current flowing through the load is small), the output voltage is high. In the case of a large load (that is, the output current is large), the output voltage is low.

Referring to FIG. 9, when the output voltage of the photovoltaic system is set to "$V_p$," the output power is maximized. Referring to FIG. 12, it is recognized that the current at this time is "$I_p$".

It is assumed that the voltage $V_p$ corresponding to the maximum output power is "10 V."

When the output current is smaller than "$I_p$," the output voltage is higher than "10 V." Therefore, no current flows from the power source 5 by virtue of the backflow prevention diode. Meanwhile, when the output current is larger than "$I_p$," the current flows from the power source 5, but the voltage is not equal to or lower than "10 V" because the power source 5 has sufficiently low impedance.

Therefore, the voltage of the load 4 as seen from the photovoltaic system is "10 V," and the current $I_p$ corresponding to the load voltage of 10 V flows on the basis of the characteristic curve of the photovoltaic system. In addition, this also corresponds to the operating point of the maximum output of the photovoltaic system.

In this manner, in a small current region, the power from the photovoltaic system is prioritized. In the case of a large load (that is, the output current is large), the current $I_p$ flows from the photovoltaic system at all times, and only the amount of the deficient current is supplied from the power source 5.

In this manner, it is possible to implement a condition in which the highest efficiency can be obtained in the use of power of the photovoltaic system.

Meanwhile, the power source 5 may output, for example, a voltage obtained by rectifying and smoothing a voltage from a commercial AC power source.

For example, a DC power source of approximately 140 V can be obtained by rectifying and smoothing a voltage from a commercial AC power source of 100 V. In this case, assuming that solar cells of the same voltage are employed, two hundred eighty (280) solar cells 2 may be connected in series.

Figure 13:
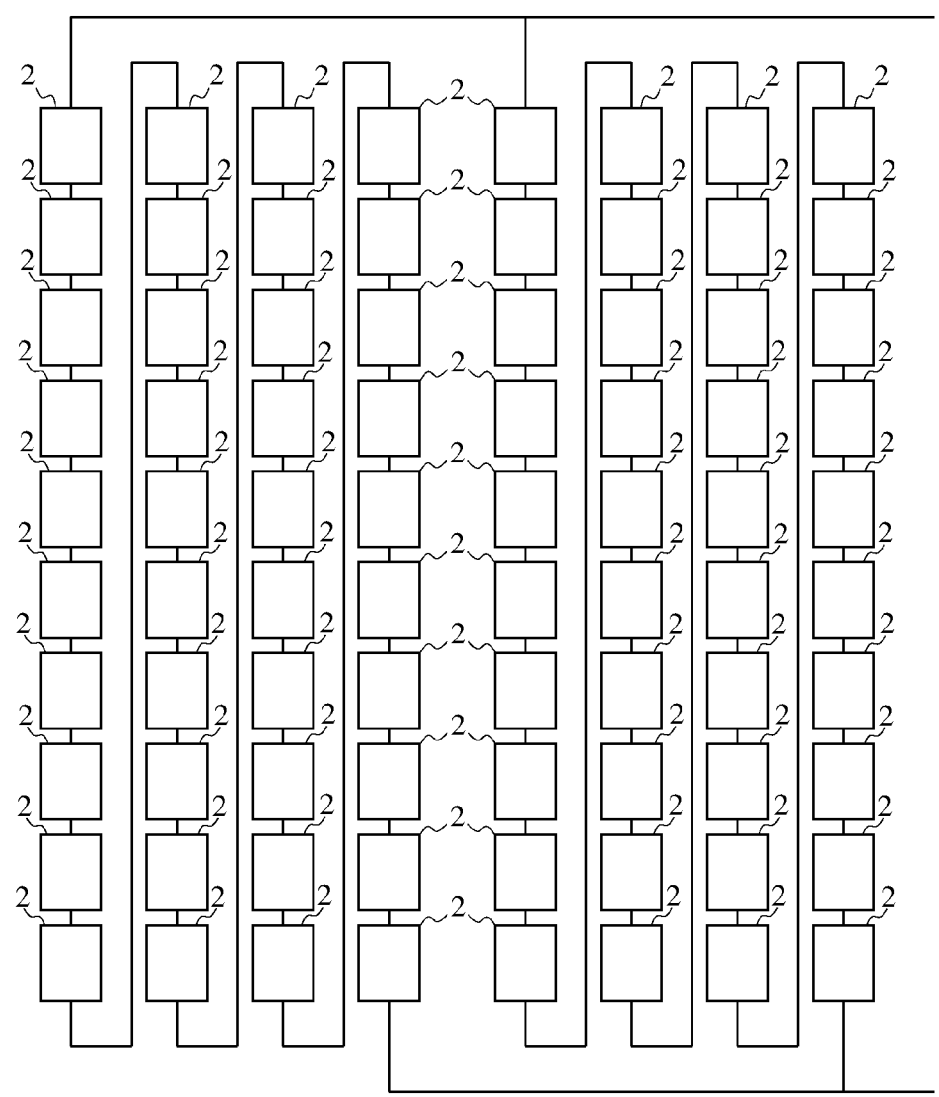
FIG. 13 is an explanatory diagram (2) illustrating a connection for obtaining voltage and current by combining solar cells.

Note that an example of the power source of 20 V is illustrated in FIG. 13.

Here, it is assumed that eighty solar cells 2 each outputting a voltage of 0.5 V and a current of 100 mA at the maximum power point are used.

If the voltage of the power source 5 illustrated in FIG. 8 and the like is set to "20 V," it is possible to set the voltage corresponding to the maximum power point of the photovoltaic system to "20 V" by connecting forty solar cells 2 in series. Since the number of the solar cells 2 is eighty, a pair of strings can be obtained. By connecting the pair of strings in parallel, it is possible to obtain a voltage of 20V and a current of 200 mA at the maximum power point.

If this example is applied to the case of FIG. 12, the current $I_p$ of FIG. 12 is 200 mA. When the output current is smaller than 200 mA, the output voltage of the photovoltaic system side becomes higher than 20 V ($=V_p$). Therefore, by virtue of the backflow prevention diode D, the current does not flow from the power source 5.

Meanwhile, when the output current is larger than 200 mA, the current flows from the power source 5. However, it is not equal to or lower than 20 V because the power source 5 has sufficiently low impedance.

Therefore, the voltage of the load 4 as seen from the photovoltaic system side is 20 V. A current of 200 mA corresponding to the load voltage of 20 V flows on the basis of the characteristic curve of the photovoltaic system. In addition, this also corresponds to the operating point of the maximum output of the photovoltaic system.

In this manner, in a small current region, the power from the photovoltaic system is prioritized. In the case of a large load (that is, the output current is large), a current of 200 mA flows from the photovoltaic system at all times, and only the amount of the deficient current is supplied from the power source 5.

3. So-Called Maximum Power Point Tracking Control of Photovoltaic System by Measuring Current If the ammeter A is connected as illustrated in FIG. 14, it is possible to simply perform the maximum power point tracking control on the basis of the current value and the configuration change of the photovoltaic system using the switch circuit without necessity of measuring the voltages of the power source 5 and the photovoltaic system even when the characteristic of the photovoltaic system is not known.

The description will now be made with reference to the accompanying drawings.

Figure 10:
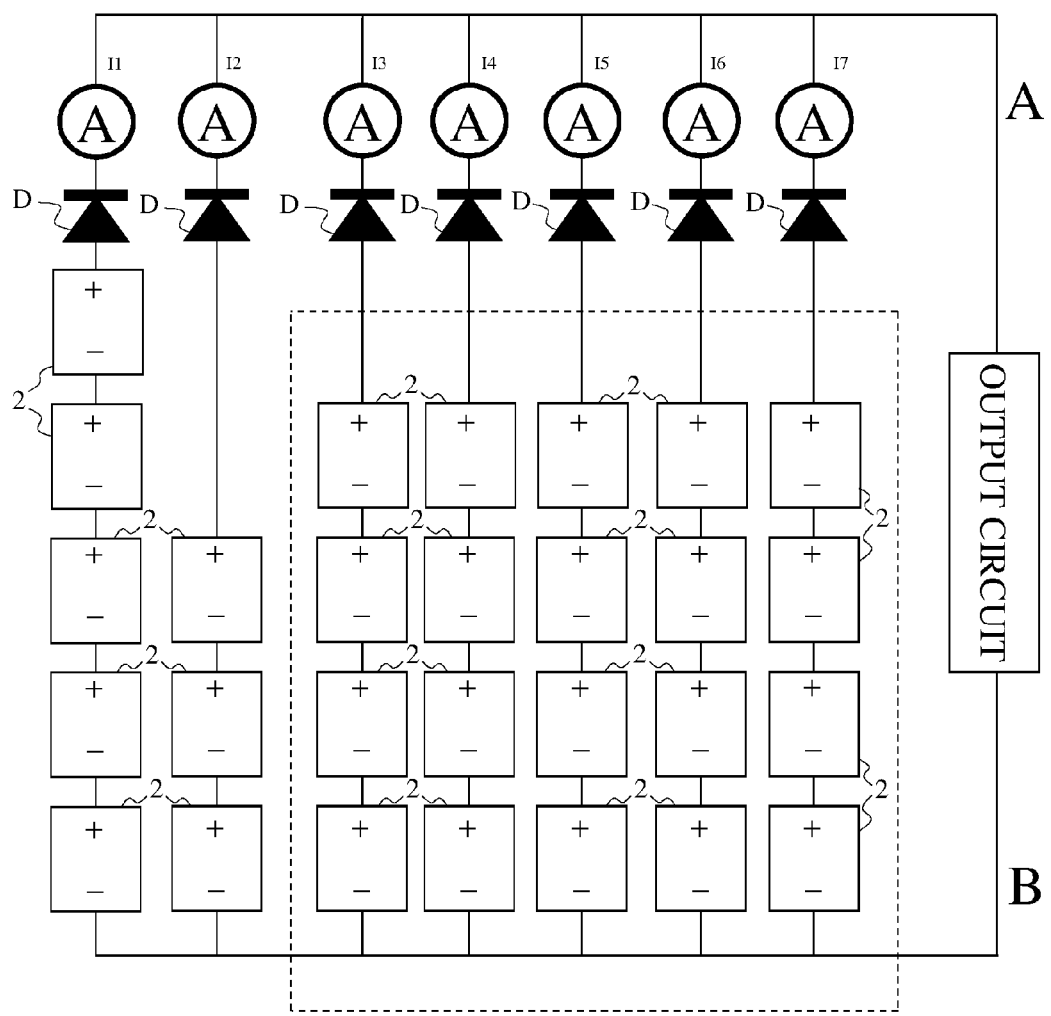
FIG. 10 is an explanatory diagram for describing maximum power point tracking.

In order to investigate a change of the generated power by changing the number of solar cells connected in series, the number of solar cells in a certain string is incremented by one, and the number of solar cells in another string is decremented by one (FIG. 10).

Note that the switch setting state is expressed by wiring for simplicity purposes here. In addition, in FIG. 8, the backflow prevention member D, the power source 5, and the load 4 are collectively denoted by an "output circuit" in FIG. 10. The voltage between the terminals A and B is denoted by "$V_{AB}$" and the measurement values of each ammeter A are denoted by I1 to I7. Furthermore, it is assumed that there is no difference in characteristics between solar cells. Moreover, the amount of incident light and the temperature are the same across overall solar cells.

In the path where the current I3 flows, four solar cells having the same characteristics are connected in series, and the voltage across the terminals A and B is "$V_{AB}$." Therefore, a voltage V3 for a single solar cell is set to:

$$V3 = \frac{V_{AB}}{4}.$$

Since the current value is "I3," the generated power value P3 for a single solar cell in this string becomes:

$$P3 = I3 \times V3 = \frac{I3 \times V_{AB}}{4}.$$

Although the current I3 has been described, this similarly applies to the currents I4 to I7. Therefore, the power generated from any solar cell illustrated in the dotted-lined box is equal to the power value P3.

Similarly, the generated power values P1 and P2 for a single solar cell in the current paths I1 and I2 are obtained.

In the current path I1, five solar cells are connected in series. In the current path I2, three solar cells are connected in series. The voltages V1 and V2 for a single solar cell in each string can be expressed as:

$$V1 = \frac{V_{AB}}{5}$$

$$V2 = \frac{V_{AB}}{3}.$$

From this formula, the power generated from a single solar cell of each string can be obtained as follows:

$$P1 = I1 \times V1 = \frac{I1 \times V_{AB}}{5}$$

$$P2 = I2 \times V2 = \frac{I2 \times V_{AB}}{3}.$$

In this manner, it is possible to obtain the power generated from a single solar cell when the number of solar cells is incremented and decremented.

Here, "P3" denotes the power generated from a single solar cell when four solar cells are connected in series, "P1" denotes the power generated from a single solar cell when five solar cells are connected in series, "P2" denotes the power generated from a single solar cell when three solar cells are connected in series.

This can be summarized as follows:

$$P3 = \frac{I3}{4} \times V_{AB}$$

$$P1 = \frac{I1}{5} \times V_{AB}$$

$$P2 = \frac{I2}{3} \times V_{AB}$$

Here, since the voltage $V_{AH}$ is common, the magnitude relationship of the power values P3, P1, and P2 is equal to the magnitude relationship of the current values I3/4, I1/5, and I2/3. Therefore, it is recognized that the power generated from a single solar cell can be compared only using the current values and the number of solar cells connected in series (a value obtained by dividing the current value by the number of solar cells connected in series).

In this manner, in regard to the number of solar cells connected in series, a string having the incremented number of solar cells and a string having the decremented number of solar cells are separately prepared. Therefore, it is possible to determine whether the power generated from a single solar cell is improved by incrementing the number of solar cells, decrementing the number of solar cells, or maintaining the number of solar cells.

As a result, by reflecting the number of solar cells connected in series, by which the highest power can be output, to the entire configuration of the photovoltaic system, it is possible to obtain higher generated power. By repeating this process, it is possible to reach an optimum state. That is, it is possible to obtain the maximum power point.

In this case, it is possible to determine the maximum power point by changing only a part of the configuration (two strings) instead of the entire configuration. Therefore, it is possible to optimize the number of solar cells connected in series without degrading efficiency of the entire system. In addition, in the methods of the prior art such as a hill climbing method, a time lag exists between a measurement under a certain condition and the next measurement under a different condition. Therefore, if the amount of light changes meanwhile, it may be difficult to perform proper tracking. In the method according to the present invention, since the power values of the same time point can be compared, there is no time lag. In addition, it is possible to properly perform maximum power point tracking even under an irregular weather condition (in which the amount of light abruptly changes).

Note that, although the maximum power point tracking is achieved by changing the number of solar cells connected in series from four to three and five in the aforementioned description, this can similarly applies to a case where the number of solar cells connected in series is changed to any number other than four.

4. When Voltage Change of Power Source Occurs

In the method according to the present invention, the system is operated without a problem even when the voltage of the power source 5 is fluctuated.

Although the power values P3, P1, and P2 are compared in the aforementioned description, such a power magnitude relationship is not influenced by the voltage of the power source as recognized from each formula. For this reason, even when the voltage of the power source is fluctuated, it is possible to detect the number of solar cells connected in series optimized for the current voltage at all times.

5. Modification of Configuration

Figure 11:
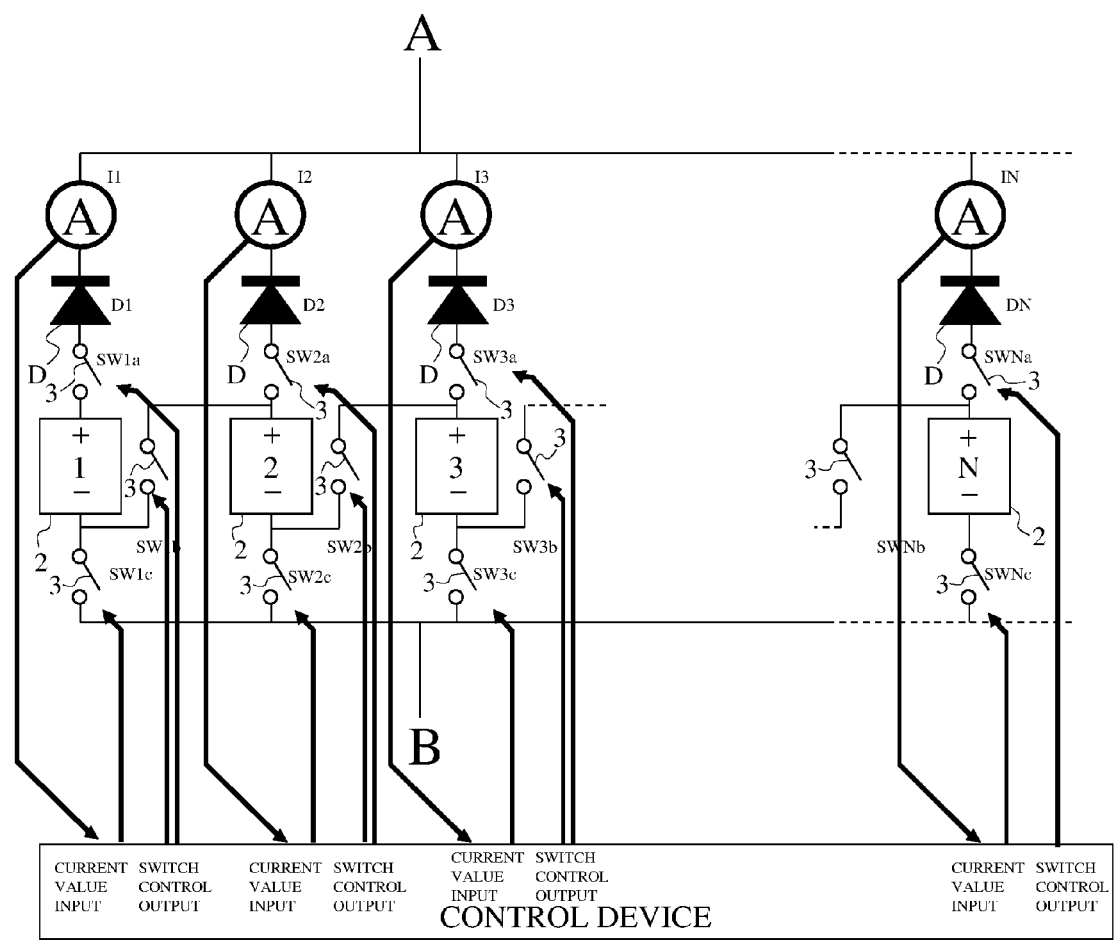
FIG. 11 is a schematic circuit diagram illustrating a configuration change of the photovoltaic system.

FIG. 11 illustrates an exemplary modification of the configuration of the photovoltaic system. A one-chip microcomputer may be employed as a control device, and a latching type relay may be employed as the switch. The configuration of the photovoltaic system is modified as described above such that the current measurement value is received by the control device, and the switches are controlled on the basis of the received current measurement value.

6. Efficiency

According to the present invention, a surplus cell may be generated in the photovoltaic system depending on a connection scheme (setup voltage) (Formula 3). However, this can be computable. Therefore, it is possible to implement maximum efficiency using the method according to the present invention by considering this computable value in the maximum power point tracking.

For example, similar to the example of the maximum power point tracking, the effective number of solar cells can be expressed as follows:

power value for a single solar cell when X solar cells are connected in series:

$$N - X \cdot \text{int}\left(\frac{N}{X}\right),$$

power value for a single solar cell when (X+1) solar cells are connected in series:

$$N - (X+1) \cdot \text{int}\left(\frac{N}{(X+1)}\right),$$

and power value for a single solar cell when (X−1) solar cells are connected in series:

$$N - (X-1) \cdot \text{int}\left(\frac{N}{(X-1)}\right),$$

where "P3" denotes a power value for a single solar cell when X solar cells are connected in series, "P1'" denotes a power value for a single solar cell when (X+1) solar cells are connected in series, and "P2" denotes a power value for a single solar cell when (X−1) solar cells are connected in series.

In this case, the generated power of the entire photovoltaic system can be obtained as follows:

entire power value Q3 when X solar cells are connected in series:

$$Q3 = \left\{N - X \cdot \text{int}\left(\frac{N}{X}\right)\right\} \times P,$$

entire power value Q1 when (X+1) solar cells are connected in series:

$$Q1 = \left\{N - (X+1) \cdot \text{int}\left(\frac{N}{(X+1)}\right)\right\} \times P1,$$

and entire power value Q2 when (X−1) solar cells are connected in series:

$$Q2 = \left\{ N - (X-1) \cdot \text{int}\left(\frac{N}{(X-1)}\right) \right\} \times P2.$$

Finally, the connection can be changed to maximize these values. Similarly, in this case, the magnitude relationship is not changed even when the power values P3, P1, and P2 of each formula are substituted with I3/X, I1/(X+1), and I2/(X−1). Therefore, it is possible to use these values for computation.

Specifically, a string having the incremented number of solar cells (+1) and a string having the decremented number of solar cells (−1) may be prepared periodically. Then, the power values described above are computed for each case, and a condition where the highest values can be obtained may be selected. For example, if the power value is highest when the number of solar cells connected in series is incremented (+1), a solar cell may be added (+1) to the existing array. In contrast, if the power value is highest when the number of solar cells connected in series is decremented (−1), a solar cell may be omitted (−1) from the existing array. If the power value is highest when the number of solar cells connected in series is not changed, the existing array may be maintained.

In this manner, according to the present invention, in order to obtain the highest efficiency of the photovoltaic system, that is, in the maximum power point tracking of the photovoltaic system, it is not necessary to measure (operate) the photovoltaic system under different conditions unlike the methods of the prior art such as a hill climbing method. Therefore, it is possible to maintain high power efficiency.

In addition, in the maximum power point tracking described above, it is necessary to measure only the current, and there is no need to measure the voltage.

Furthermore, the power source apparatus can be configured just by the photovoltaic system, the switch circuit, and another type of power source. In addition, a power circuit (for example, a power component such as a switching regulator) is not necessary.

In the methods of the prior art such as a hill climbing method, a time lag exists between the measurement times, and this may make it difficult to perform proper maximum power point tracking when the weather abruptly changes. However, according to the present invention, such a time lag does not exist. Therefore, it is possible to stably perform the maximum power point tracking even in an abrupt weather change.

When the total number of solar cells 2 is large, and the output voltage is low, the influence of the surplus cell 2 is insignificant. However, if the total number of solar cells 2 is small, and the output voltage is high, the surplus number of solar cells 2 may influence on the maximum power point tracking. That is, as illustrated in FIG. 9, when a graph has a single hill, tracking can be performed using the method described above. However, when two or more hills are generated due to the influence of the surplus cell 2, the maximum power point may stay in the lower hill, and it may be difficult to find the maximum power point in the higher hill.

In this case, first, the number of solar cells connected in series may be changed to the number by which the largest current can be output only using the current and the number of solar cells 2 regardless of the number of surplus cells 2. Then, the current value may be investigated for each case by changing the number of cells connected in series from the number of cells 2 by which the largest current can be output to the number having no surplus cell 2. As a result, it is possible to obtain a condition in which the highest total power can be output from the entire photovoltaic system by changing the number of solar cells for each case. Therefore, it is possible to perform maximum power point tracking.

REFERENCE SIGNS AND NUMERALS 1 solar cell switch circuit
2 solar cell
3 switch
4 load
5 power source
D backflow prevention member
A ammeter

The invention claimed is:

1. A power source circuit that combines power generated from a photovoltaic system and power generated from another power source by using a power combiner and transmits the combined power to a load side,
wherein an output voltage of the photovoltaic system can be changed by changing a cell connection state of a plurality of solar cells of the photovoltaic system,
the highest efficiency of the photovoltaic system can be obtained by adding the output voltage of the photovoltaic system to an output voltage of the another power source,
multiple types of solar cell series connection circuits are formed by changing the number of connections of the solar cells,
current values flowing through each of the multiple types of solar cell series connection circuits are detected,
one of the solar cell series connection circuits having a highest number out of values obtained by dividing the detected current value by the number of solar cells connected in series is determined, and
the determined series connection circuit is selected as a series connection circuit having the number of connections used approximately in the highest efficiency of the photovoltaic system.

2. A power source apparatus that combines power generated from a photovoltaic system and power generated from another power source by using a power combiner and transmits the combined power to a load side,
wherein an output voltage of the photovoltaic system can be changed by changing a cell connection state of a plurality of solar cells of the photovoltaic system,
the highest efficiency of the photovoltaic system can be obtained by adding the output voltage of the photovoltaic system to an output voltage of the another power source,
multiple types of solar cell series connection circuits are formed by changing the number of connections of the solar cells,
current values flowing through each of the multiple types of solar cell series connection circuits are detected,
one of the solar cell series connection circuits having a highest number out of values obtained by dividing the detected current value by the number of solar cells connected in series is determined, the determined series connection circuit is selected as a series connection circuit having the number of connections used approximately in the highest efficiency of the photovoltaic system, and the determination is repeated in order to automatically and continuously perform highest efficiency operation of the photovoltaic system depending on a weather change when the current value flowing through the multiple types of solar cell series connection circuits is changed by the weather change.

\* \* \* \* \*